United States Patent [19]

Negishi et al.

[11] Patent Number: 5,498,557

[45] Date of Patent: Mar. 12, 1996

[54] METHOD OF MAKING SRAM TO IMPROVE INTERFACE STATE DENSITY UTILIZING PMOS TFT

[75] Inventors: Michio Negishi; Ihachi Naiki, both of Kanagawa; Masayoshi Sasaki, Tokyo; Tadayuki Kimura, Kanagawa, all of Japan

[73] Assignee: Sony Corporation, Tokyo, Japan

[21] Appl. No.: 227,343

[22] Filed: Apr. 14, 1994

Related U.S. Application Data

[62] Division of Ser. No. 78,035, Jun. 18, 1993, abandoned.

[30] Foreign Application Priority Data

Jun. 20, 1992 [JP] Japan ..................................... 4-185797
Jun. 29, 1992 [JP] Japan ..................................... 4-194869

[51] Int. Cl.⁶ .................................................. H01L 21/84
[52] U.S. Cl. ........................ 437/40; 437/46; 437/941; 437/968
[58] Field of Search ................................ 437/40 TFI, 46, 437/941, 968

[56] References Cited

U.S. PATENT DOCUMENTS 4,797,108  1/1989  Crowther ................................... 437/41
5,198,379  3/1993  Adan ......................................... 437/41

*Primary Examiner*—George Fourson
*Assistant Examiner*—Richard A. Booth
*Attorney, Agent, or Firm*—Hill, Steadman & Simpson

[57] ABSTRACT

A thin film transistor in which a device active layer is formed on an insulation film. In which an interface state density present at the interface between the active layer and the insulation film is set to less than $1\times10^{11}/cm^2$. The characteristics of TFT can be enhanced by decreasing the leak current and SRAM memory cell can be provided with easy design for the process and the structure while avoiding increase in the resistance and additional capacitance and ensuring voltage withstand.

1 Claim, 19 Drawing Sheets

Drain current versus gate voltage

Drain current versus gate voltage

Ion and Ioff versus poly Si thickness

METHOD OF MAKING SRAM TO IMPROVE INTERFACE STATE DENSITY UTILIZING PMOS TFT

This is a division of application Ser. No. 08/078,035, filed Jun. 18, 1993 now abandoned.

BACKGROUND OF THE INVENTION

1. Field of the Invention

The present invention concerns an SRAM memory cell structure by using a thin film transistor and a method of forming the SRAM memory cell structure.

2. Description of the Related Arts

Utilization of a thin film transistor, in particular, a thin film transistor having, for example, a poly-Si active layer to a liquid crystal display apparatus, static random access memory (SRAM) or the like has started and its technical importance has been increased more and more in recent years.

A poly-Si thin film transistor (hereinafter sometimes simply referred to as TFT) has an undesirable characteristic of small ON-current and large OFF current due to the effect of traps present at the grain boundary of poly-Si, for which an improvement has been desired.

In particular, in a case of applying TFT to an SRAM, it is extremely important to decrease the OFF current, that is, leak current of TFT in order to keep a data possessing current at a low level.

It has been considered for the TFT leak current that it is mainly composed of a tunnel current by way of grain boundary traps as described, for example, The Technical Report of Electron Information Communication Society, SDM 90-141 (Kato, 1990) or the like, and an effort has been made for the creasing the grain boundary traps. For this purpose, there has been mainly adopted, for example, a method of increasing the size of grains and substantially decreasing the number of grain boundaries contained in TFT thereby decreasing the traps as well, or a method of inactivating traps by utilizing hydrogen contained in plasma SIN.

However, no satisfactory characteristic has yet been obtained even by using the above-mentioned method and a guiding principle for improving the characteristic is not definite at present.

FIG. 1 shows an example of a common CMOS-SRAM memory structure using a thin film transistor (hereinafter referred to as TFT). The figure shows a substrate structure of a unit cell in which word transistors and driver transistors are formed on an Si substrate, load devices are stacked on the upper layer thereof, a word line 7 is disposed to the center of the cell, and two driver transistors (electrodes thereof are shown by 8, 9) are disposed on both sides substantially in parallel and in a point-to-point symmetry with respect to the center of the cell.

FIG. 2 shows a cross sectional view taken along line X-X' in FIG. 1, FIG. 3 is a cross sectional view taken along line Y-Y' and FIG. 4 is a circuit diagram for the SRAM memory cell.

In FIG. 4 showing the memory cell circuit, transistors 1, 6 are word transistors, transistors 2, 5 are driver transistors and transistors 3, 4 are load transistors.

In highly integrated memories after 4MSRAM, it is customary that word transistors and driver transistors are formed on an SI substrate and load transistors are constituted with PMOS-TFT. FIG. 1 shows a structure as an example, in which only the arrangement for gate electrodes of the word transistors and the driver transistor, as well as relevant contacts are shown. That is, the electrode 7 is a word line, electrodes 8, 9 are driver transistors and a portion depicted by reference numeral 10 in FIG. 1 is an interdevice isolation region for separating them. A signal taken out of a node contact 11 passes through the word transistor 7 and is then taken out by way of a diffusion layer below the contact of the electrode 8 from a bit contact 12. In the drawing, the signal is shown at 18.

In this prior art, for transmitting the signal from the memory node contact 11 to the bit contact 12, it has to be passed through the diffusion layer below the gate electrode 8 of the driver transistor (refer to as a bypass diffusion layer 13. Also refer to FIGS. 2 and 3), which brings about problems such as increase of resistance, increase of capacitance and difficulty in ensuring the insulation withstand voltage.

FIGS. 2 and 3 are fragmentary cross sectional views for this prior-art. For the doping to this portion, impurities are injected through a resist mask at the time of threshold controlling ion implantation.

OBJECTS AND SUMMARY OF THE INVENTION

A first object of the present invention is to provide a thin film transistor having a satisfactory characteristic and a decreased leakage-current, as well as provide a method of manufacturing a thin film transistor.

A second object of the present invention is to provide an SRAM memory cell structure capable of facilitating the design for a process and a structure capable of avoiding problems such as increase of resistance, increase of capacitance and difficulty in ensuring the insulation withstand voltage.

A third object of the present invention is to provide a method of manufacturing an SRAM memory cell structure for preventing problems such as increase of resistance, increase of additional capacitance and degradation of insulation withstand voltage.

DETAILED DESCRIPTION OF THE PREFERRED EMBODIMENTS

Description will now be made to the basic principle of the present invention. At first, description will be made to the analysis of a leak current.

Figure 5:
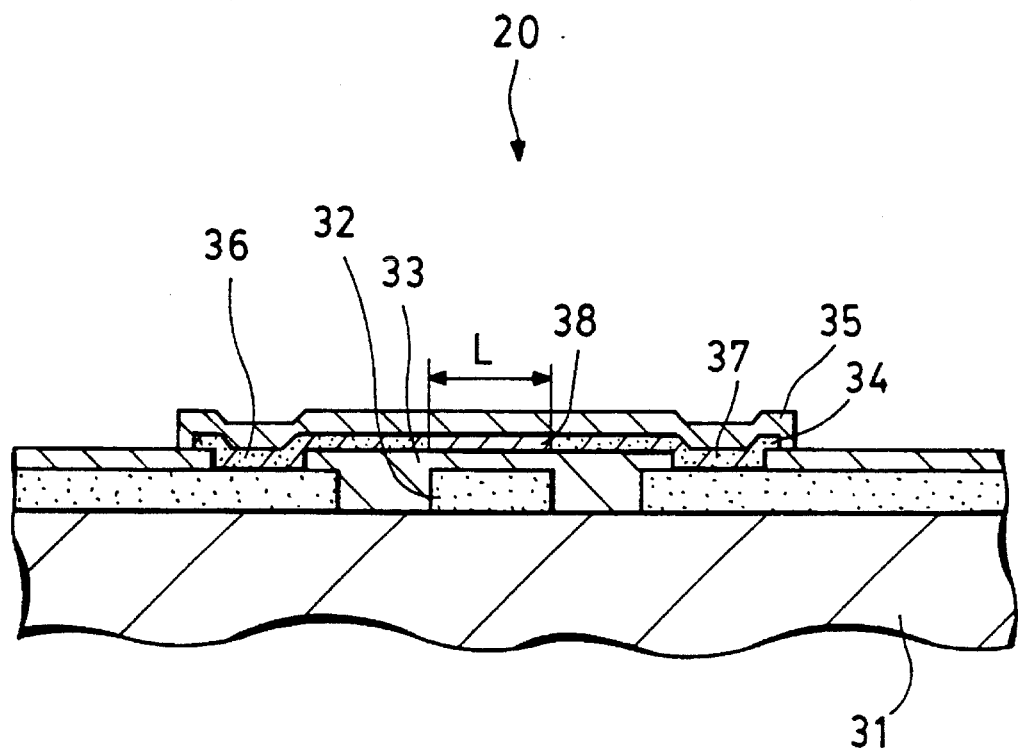
FIG. 5 is a schematic cross sectional view for illustrating the present invention.

FIG. 5 is a schematic cross sectional view illustrating an example of a TFT structure according to the present invention.

As illustrated in FIG. 5, TFT according to the present invention is a thin film transistor having an active layer for a device formed on an insulation film 33 (in FIG. 5, reference numeral 34 shows a poly-Si Si film for forming an active layer in this structural example in which the interface state density present at the interface between the active layer 34 and the insulation film 33 is made to less than $1 \times 10^{11}/cm^2$.

In the example of the structure illustrated in FIG. 5, a gate electrode 32 is formed on the upper surface of a substrate 31 having an insulation property at least on the surface. The substrate 31 is made, for example, of a silicon oxide substrate, while the gate electrode 32 is made of poly-Si, for example, introduced with P-type impurity. A gate insulation film 33 made of a silicon oxide film is formed so as to cover the gate electrode 32. Poly-Si Si film 34 as an active layer of a thin film transistor to be formed is provided on the gate insulation film 33. A silicon dioxide film 35 is formed in the surface of the poly-Si 34. Source-drain regions 36, 37 are formed to the poly-Si film 34 on both sides of the gate electrode 32. A portion of the poly-Si film 34 between the source-drain regions 36, 37 forms a channel region 38. The thin film transistor 20 is thus formed.

Figure 6:
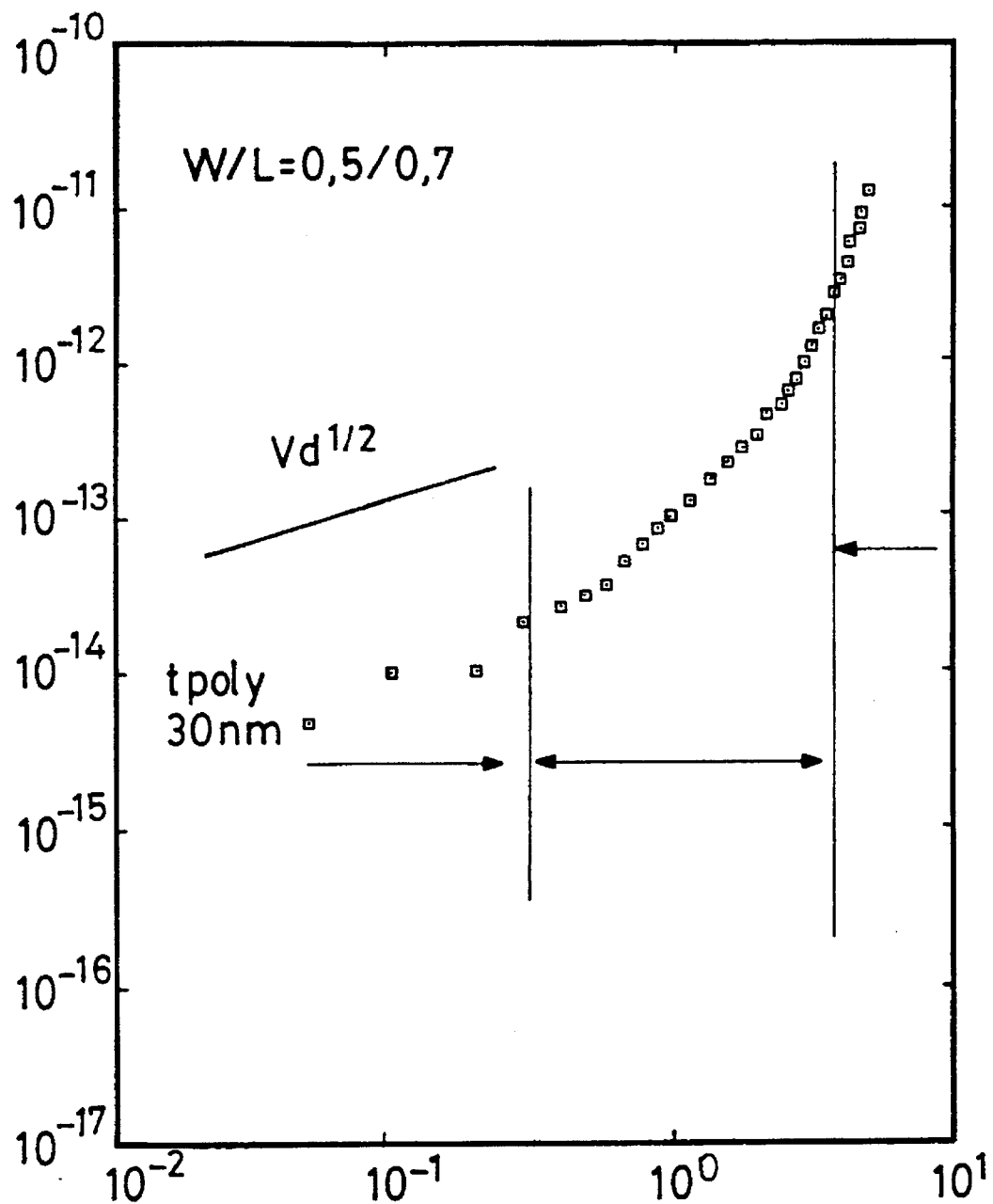
FIG. 6 is a diagram illustrating a leak current characteristic (relationship between a drain current and a leak current).

FIG. 6 shows a leakage current characteristic of the PMOS TFT as described above. The abscissa denotes a drain voltage VD and the ordinate denotes a drain current ID, with the gate voltage at 0 V. Accordingly, the drain current shows TFT leakage current.

As a result of the detailed study on the characteristic shown in FIG. 6, the present inventors have attained the following novel finding.

(1) at an absolute value for the drain voltage Vd lower than 0.3 V, the following relationship is present between Id and Vd:

$$Id \propto \sqrt{Vd}$$

which shows that Id is a generation recombination current based on a classic Schockley Lead hole model.

(2) in a region where the absolute value of the drain voltage Vd is about from 0.3 to 3 V, Id is a filed enhanced type generation current.

(3) if the absolute voltage Vd exceeds 3 V, inter-band tunnel type leak current begins to develop, and this component constitutes a main ingredient of the leak at a voltage higher than 6 V.

Further, it has been known that the current (2) is theoretically expressed as:

$$I_{FE} = I_0 \exp(\alpha \sqrt{E})$$

where $I_{FE}$ is a field enhanced type generation current, $I_0$ is a low electric filed that is, a generation current corresponding to (1), $\alpha$ is a coefficient relevant to the material constant and E is a field intensity.

Accordingly, it can be seen that $I_0$ has to be reduced in order to suppress the leak current in (1) and (2) above.

According to the Schockley's lead hole model, the carrier generation velocity (amount corresponding to the leak current) is expressed as:

$$U = \frac{ANt}{\cosh(Et - Ei)/kT}$$

where A is a constant determined depending on the material, Nt is a trap density or generation recombination center density, Et is an energy level for traps, Ei is intrinsic energy level, k is Boltzman's constant and T is absolute temperature. It can be seen from the above relationship that Nt has to be reduced in order to reduce U.

Figure 7:
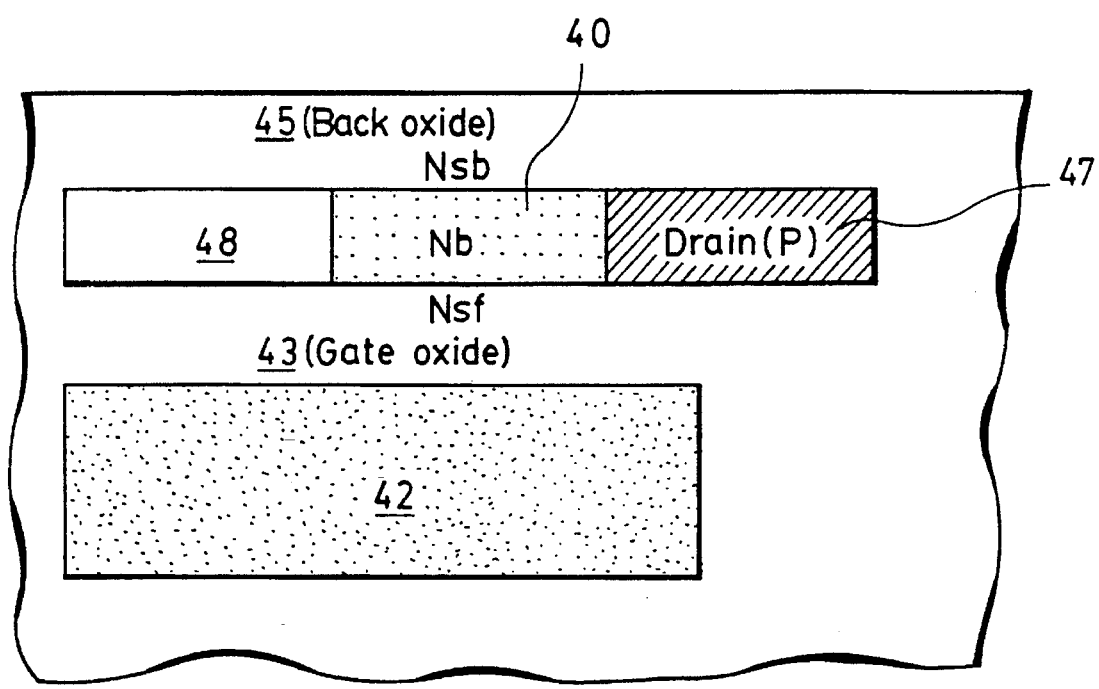
FIG. 7 is a schematic explanatory view for the interface state density.

Now, considering Nt, Nt can be expressed as:

$$Nt = Nb\, t_{poly} + Nsf + Nsb$$

where Nb is a trap volume density of a poly-Si layer, $T_{poly}$ is a thickness of the poly-Si layer, Nsb, Nsf are, respectively, interface state density at the surface and rearface of poly-Si. FIG. 7 schematically shows the above relation, near the drain of the TFT.

As shown in FIG. 7, near the end of the drain region 47 of TFT, a depletion layer 40 extends toward the channel region 48 and a leak current generates in the depletion layer.

While Si bulk traps (corresponding to Nb) have been considered, the generation center of the leak current in the depletion layer, the interface state densities Nsf, Nsd are also considered as important generation centers.

It has been well-known that the interface state density between Si and an oxide film changes depending on the method of forming the interface, which is minimum in a case where Si is directly oxidized thermally and it is about at $10^{10}/cm^2$. On the other hand, when $SiO_2$ is formed on Si, for example, by CVD, the density is generally about at $10^{12}/cm^2$ depending on the condition.

In a case of forming TFT, a method of forming an Si layer on $SiO_2$, for example, by CVD has been employed, in which the interface state density is as large as $-10^{12}/cm^2$ (this values is $10^{-12}/cm^2$ or slightly less than that here and hereinafter). This has been an inevitable problem so long as a general step is employed, because it is difficult to lower the interface state density by thermal oxidation or the like of the lower surface (on the side of the interface) of the deposited Si layer.

On the other hand, since it is easy to oxidize the surface of the deposited Si layer, $N_{sb}$ shown in FIG. 7 can be decreased easily. On the other hand, $N_{sf}$ is usually about $-10^{12} cm^2$.

Various analysis have been attempted for the trap density in the bulk and it is also considered as about $-10^{12}/cm^2$ ($N_b$xt poly) or less.

Then, in order to examine the effect of the interface level density, poly-Si active layers thermally oxidized on both surfaces, oxidized only on one surface and oxidized on none of the surfaces are prepared and $N_T$ was determined based on the analysis for the generation current in the low field region.

As a result, the following results were obtained:
With no oxidation $2.5 \times 10^{12}/cm^2$
Oxidation on one surface $9 \times 10^{11}/cm^2$
Oxidation on both surfaces $1 \times 10^{11}/cm^2$ As a result of transmission electron macroscopic observation, no particular effect is recognized for the grain of poly-Si by oxidization and $N_b$ is substantially constant.

As apparent from the result, decrease of the interface level density by oxidization has a direct effect on remarkable decrease of $N_T$. Accordingly, it is possible to decrease the leak current by this means.

The present invention has been accomplished as a result of detailed studies described above and, particularly, based on the finding that suppression of the TFT interface level density is extremely important for decreasing the leak current as described above.

(Example)

Description will now be made to preferred embodiments according to the present invention with reference to the drawings. It will, however, be apparent that the present invention is not limited at all by the embodiments to be described below.

Figure 8A:
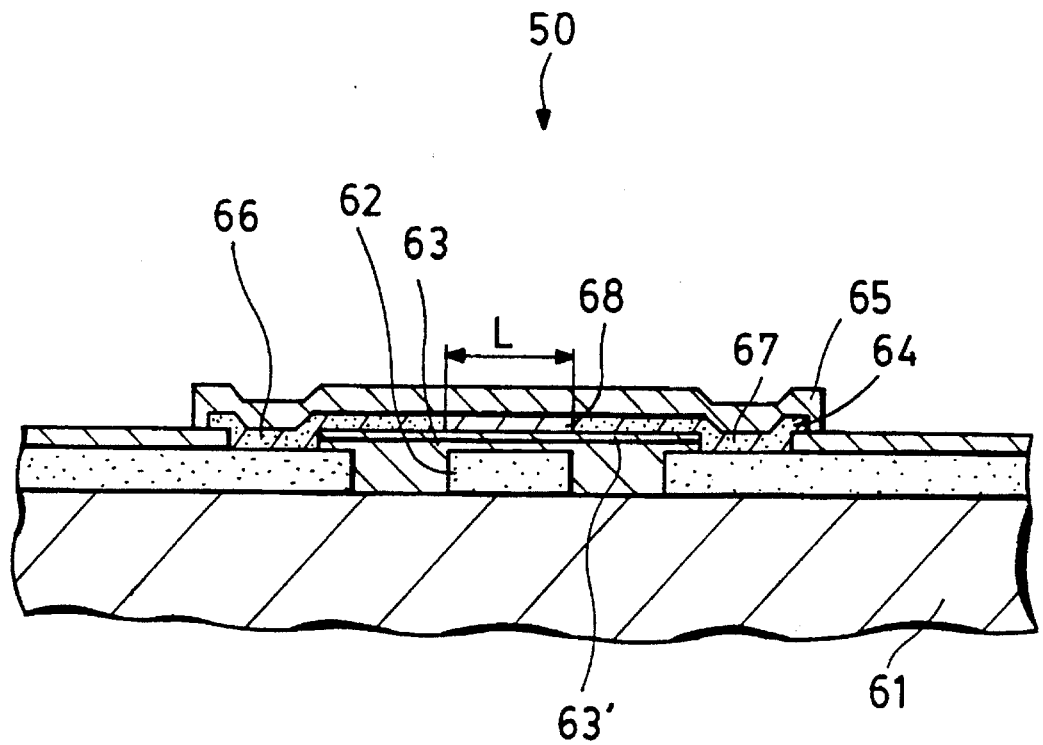
FIG. 8-A and FIG. 8-B are cross sectional views of TFT as a first embodiment according to the present invention.
Figure 8B:
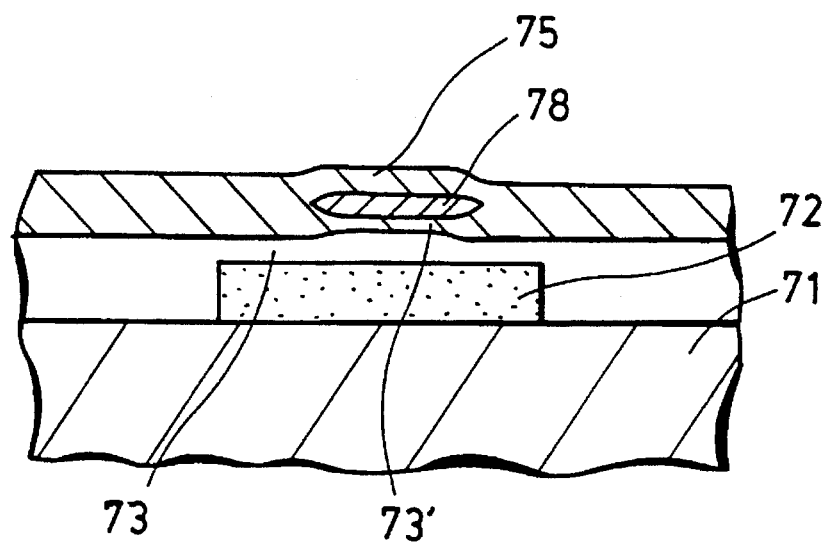
Figure 9A:
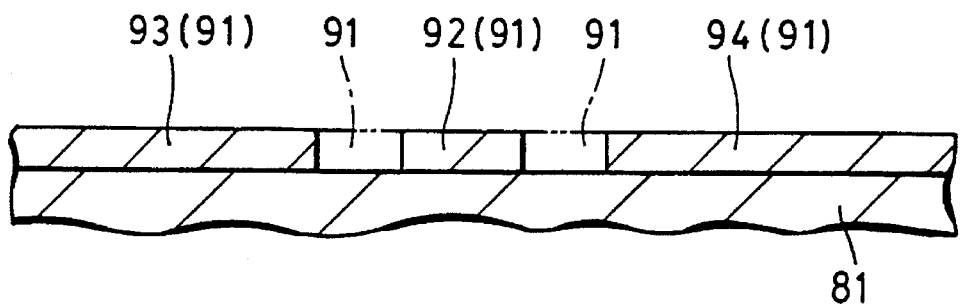
FIGS. 9-A through FIG. 9-I are views illustrating manufacturing steps (1) for TFT as a second embodiment.
Figure 9B:
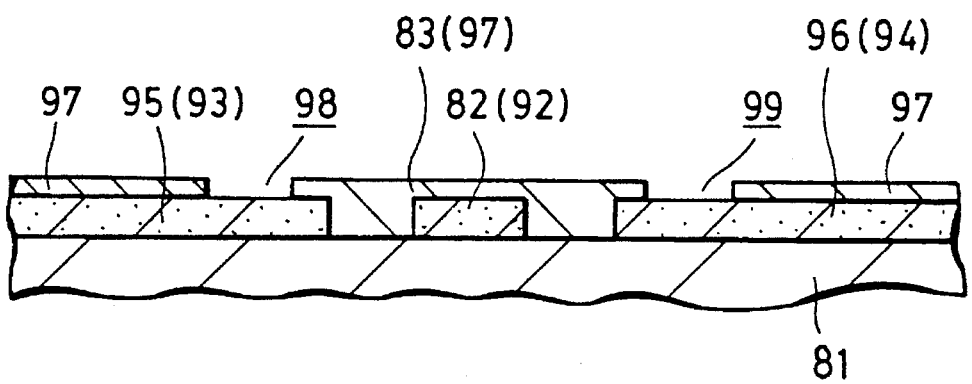
Figure 9C:
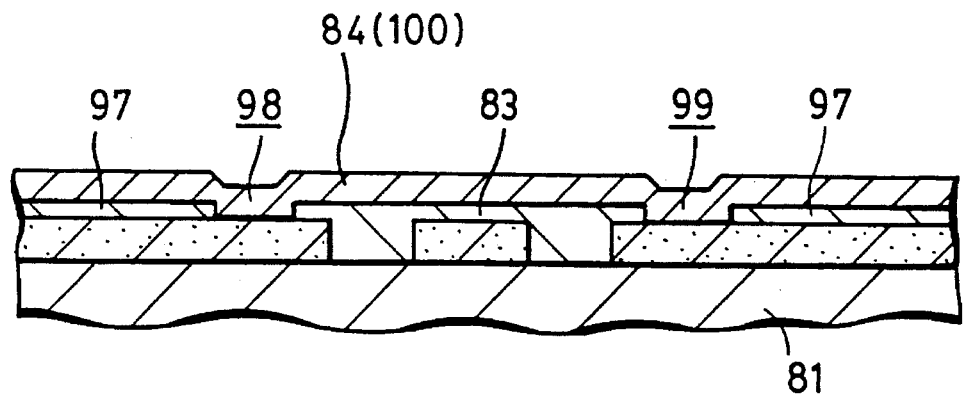
Figure 9D:
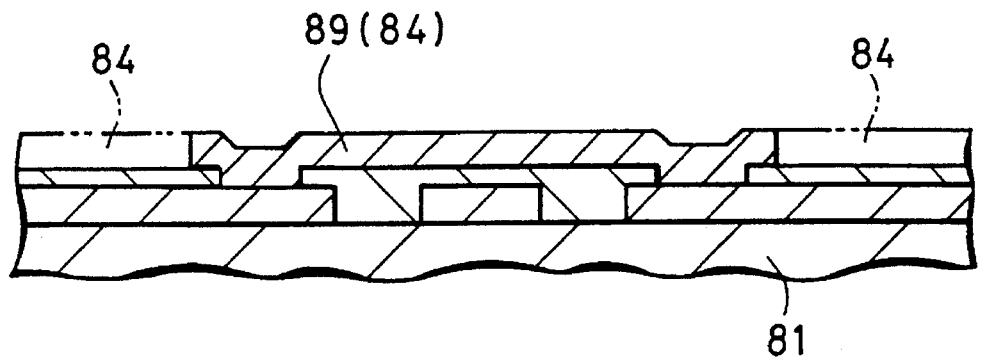
Figure 9E:
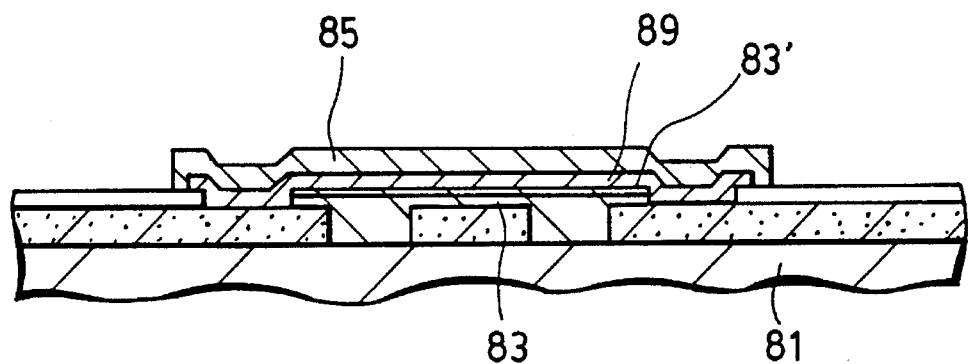
Figure 9F:
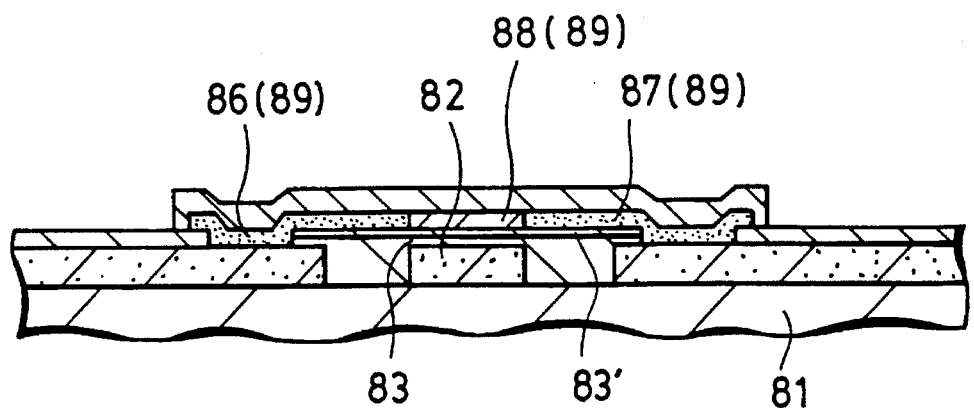
Figure 9G:
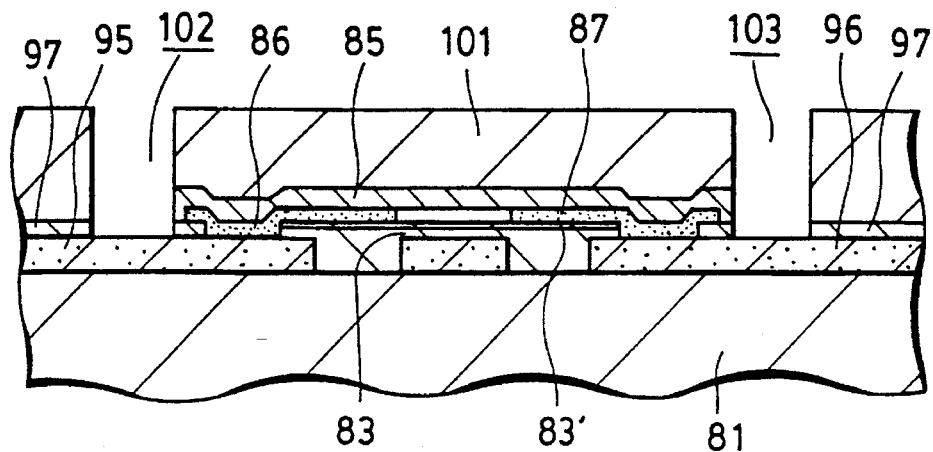
Figure 9H:
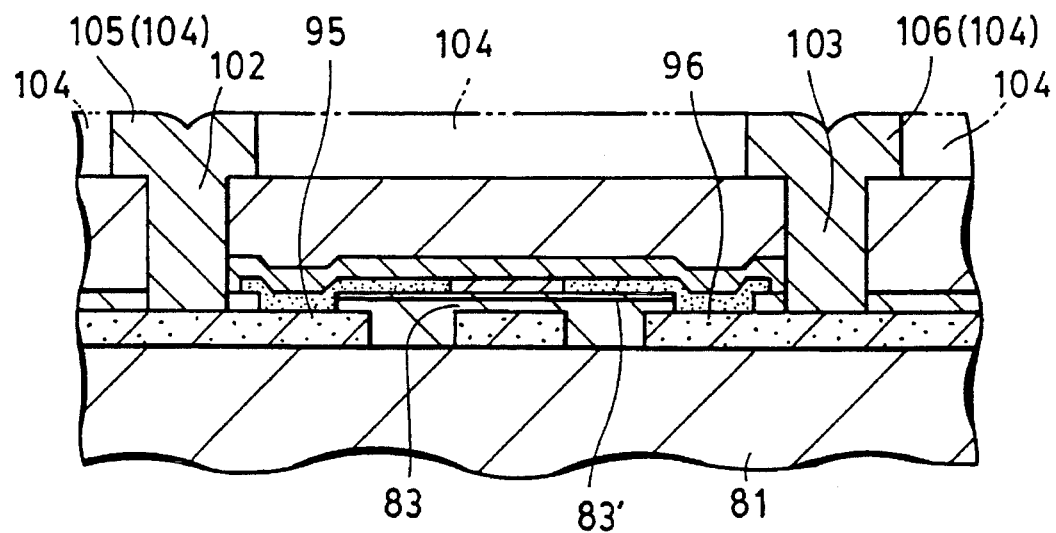
Figure 9I:
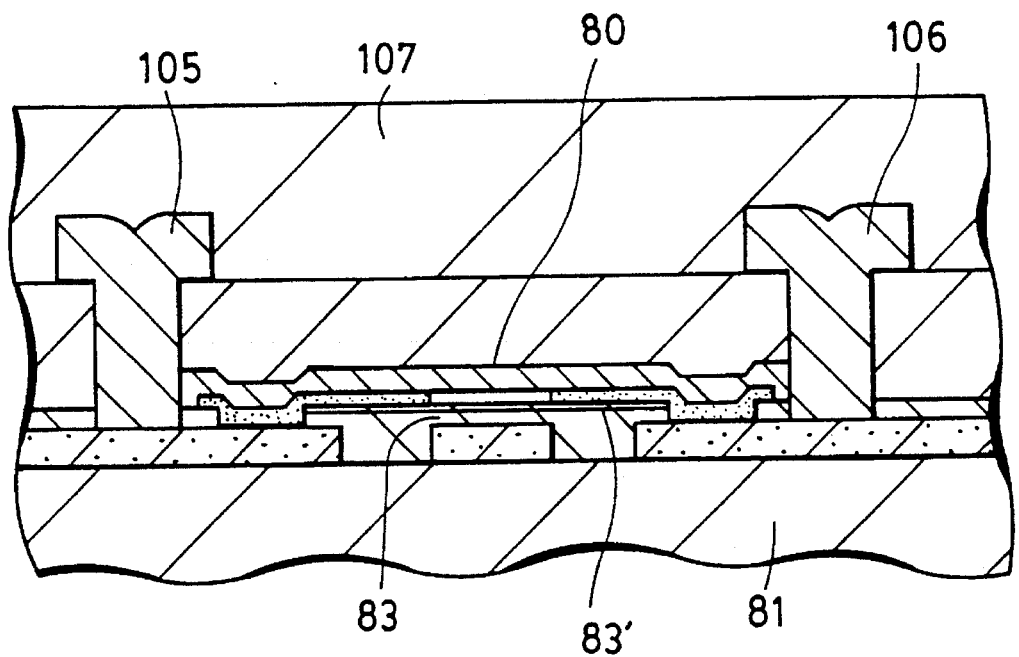

FIG. 8 is a cross sectional view illustrating a structure of TFT as a first embodiment according to the present invention, in which FIG. 8-A is a cross sectional view taken along the direction in parallel with a channel and FIG. 8-B is a cross sectional view taken along the direction in perpendicular to the channel.

In the TFT of this embodiment, a gate insulation film comprises two layers 63, 63'. The insulation film 63' is formed by oxidation for a channel region of TFT.

That is, in a poly-Si thin film transistor (TFT) of this embodiment in which an active layer 64 for a device is formed on an insulation film, at least one of surface, rearface and side of at least a region that conducts transistor operation of the active layer poly-Si layer 64 is covered with silicon oxide formed by oxidation of the active layer.

Description will now be made of a method of manufacturing the thin film transistor 50 in this embodiment with reference to FIG. 9A through FIG. 9I.

A first step shown in FIG. 9-A is conducted at first. In this step, a silicon oxide substrate is used, for example, as a substrate 81 having an insulation property at least on the surface.

A poly-Si film 91 is formed on the upper surface of the substrate 81 to a thickness, for example, of 50 nm by a chemical vapor deposition process (hereinafter simply referred to as CVD). Subsequently, portions of the poly-Si film 91 shown by dotted chains in FIG. 9-A are removed by usual photolithography and etching to form a poly-Si pattern 92, 93, 94.

Subsequently, as shown in FIG. 9-B, boron difluoride ($BF_2^+$) is intruded in the poly-Si pattern 92–94, for example, by an ion implantation method. The conditions for ion implantation are set, for example, to 20 KeV of ion implantation energy and $1 \times 10^{15}/cm^2$ of dose rate. Then, the poly-Si silicon pattern 92 is converted into P-type to form a gate electrode 82. In the same manner, the poly-Si patterns 93, 94 are converted into P-type to form $P^+$ source and drain take-out electrodes 95, 96.

Subsequently, a silicon oxide film is formed on the surface of the gate electrode 82 and the surface of the source-drain take-out electrodes 95, 96 to a thickness, for example, of 35 nm by a low pressure CVD using, for example, silane as a reaction gas. Further, dry oxidation was applied at 850° C. for improving the insulation property to increase the thickness of the silicone oxide film further by about 5 nm. Accordingly, a silicon oxide film 97 of 40 nm thickness is formed. The silicon oxide film 97 on the gate electrode 82 forms a gate insulation film 83.

Subsequently, the silicon oxide film 97 on the $P^+$ source-drain take-out electrodes 95, 96 are partially removed by usual photolithography and etching to form contact holes 98, 99. Thus, the structure as shown in FIG. 9-B is obtained.

Then, a second step is conducted As shown in FIG. 9-C, an amorphous silicon film 100 is formed in this step by low pressure CVD on the inside of the contact holes 98, 99 and the surface of the gate insulation film 83 and the surface of the silicon oxide film 97, for example, to a thickness of 30 nm. As the film-forming condition, the film-forming temperature is set to 450° C., and the pressure for the film-forming atmosphere is set to 0.67 kPa, for instance.

Subsequently, the amorphous silicon film 30 is crystallized by applying an annealing treatment (low temperature solid phase crystallization treatment) at 600° C. for 30 hours to form a poly-Si film 84. The crystal grain size of the poly-Si film 84 is, for example, about 2 um.

Then, as shown in FIG. 9-D, portions of the poly-Si silicon film 84 denoted by the dotted chains are removed, and the remaining poly-Si film 84 forms an active region forming portion 89.

Subsequently, a third step is conducted In this step, as shown in FIG. 9-E, dry oxidation is conducted at 850° C. to oxidize the active region forming portion 89 thereby forming a silicon oxide film 85 of 10 nm–20 nm thickness. Accordingly, the thickness of the active region forming portion 89 is from 10 nm to 20 nm by oxidation. Although dry oxidation is employed in this embodiment, oxidation may be conducted, for example, by wet oxidation as well.

By this oxidation, oxygen diffuses in the gate oxide film 83, oxidizes the lower surface of a channel poly-Si to form a second gate oxide film 83' as shown in FIG. 9-E. Oxidation for the lower surface is determined by the correlationship between each of the film thickness of the gate oxide film at the initial stage, the oxidation amount of the active layer and the width of the active layer, and a sufficient oxidation to reduce the interface state density can be attained under the conditions described above if the width of the active layer is less than 1 um.

If the thickness of the active region forming portion 89 is too thin (for example, about 5 nm or less), ON resistance is increased extremely, making the flow of ON current extremely difficult.. Therefore, ON/OFF ratio is reduced remarkably. Accordingly, the active region forming portion 89 made of the poly-Si film 84 is formed, for example, to about 10 nm thickness finally.

Then, as shown in FIG. 9-F, source-drain regions 86, 84 are formed to the active region forming portion 89 on both sides of the gate electrode 82. When the source-drain regions 86, 87 are formed, an ion implantation mask (not illustrated) is at first formed on the gate electrode 82 by usual photolithography. Then, P-type impurity is introduced, for example, to the active region forming portion 89 by usual ion implantation, to form the source-drain regions 86, 87. As the ion implantation conditions, boron difluoride BF$_2^+$) is used, for example, as the P-type impurity and ion implantation energy is set to 10 KeV and the dose rate is set to 1×10$^{14}$/cm$^2$ to 5×10$^{14}$/cm$^2$. The active region forming portion 89 between the source and drain regions 86, 87 forms a channel region 88.

Subsequently, a wiring step is conducted as shown in FIG. 9. In the wiring step, as shown in FIG. 9-G, an interlayer insulation film 101 is at first formed on the entire surface of the silicon oxide film 85, for example, by CVD. The interlayer insulation film 101 is made, for example, of silicon oxide.

Then, contact holes 102 and 103 are formed to the interlayer insulation film 101 and the silicon oxide film 97 on the source-drain take-out electrodes 95 and 96 respectively by usual photolithography and etching.

Successively, after ion implanting boron difluoride (BF$_2^+$) over the entire surface, for example, by ion implantation, annealing under rapid heating (RTA) was applied in a temperature atmosphere at 1050° C. for 10 sec, to activate the source-drain regions 86, 87.

Then, as shown in FIG. 9-H, a wiring metal film 104 is formed to the inside of the contact holes 102, 103 and the surface of the interlayer insulation film 101, for example, by a sputtering method. The wiring metal film 104 is made, for example, of aluminum or aluminum alloy.

Successively, portions of the wiring metal film 104 shown by the dotted chain are removed by usual photolithography and etching to form metal wirings 105, 106 in connection with the P$^+$ source-drain take-out electrodes 95, 96.

Subsequently, as shown in FIG. 9-I, a plasma silicon nitride (p-SiN) film is formed, for example, as a passivation film 107 on the entire surface of the metal wirings 105, 106. Further, the metal wirings 105, 106 are applied with a sintering treatment.

In the manufacturing method as described above, since the poly-Si film 64 having a grain size greater than 1/3 of the channel length (L) of the thin film transistor 10, and greater than 1/3 of the channel width (W) of the thin film transistor 50 and, then, the surface of the poly-Si film 64 is oxidized to reduce the thickness of the poly-Si film 64, a poly-Si film 64 of a large grain size and with reduced thickness can be obtained.

Further, since the lower surface of the poly-Si film is also thermally oxidized, the interface state density can be lowered sufficiently.

Since the active region forming portion is formed with the poly-Si film 64, the OFF current of TFT can be decreased and TFT of excellent characteristic with great mobility can be attained.

Figure 10:
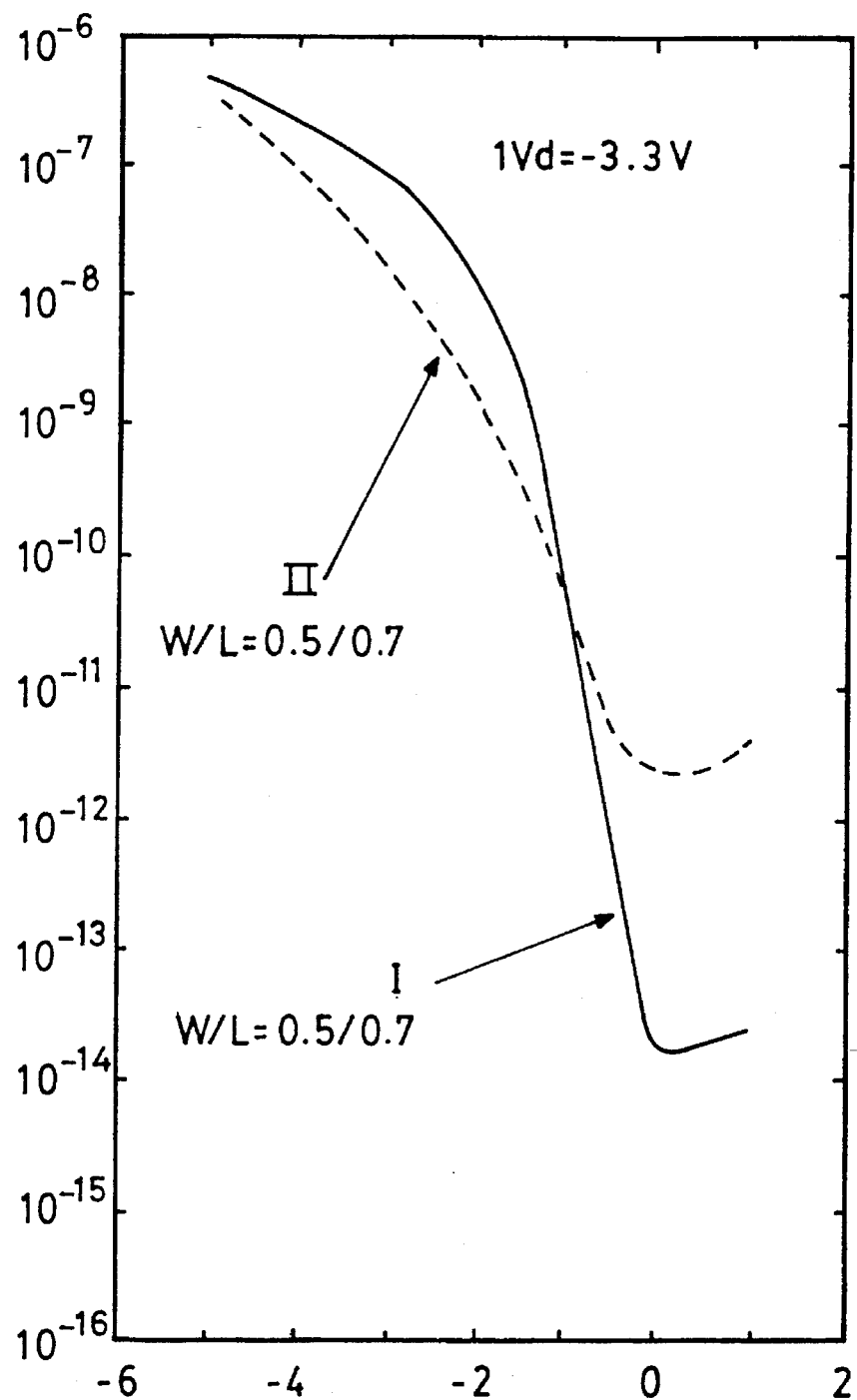
FIG. 10 is a diagram illustrating an example of a characteristic of TFT as the first embodiment according to the present invention shown in FIG. 8.

FIG. 10 shows an example of a PMOSTFT prepared by the method described above as the second embodiment according to the present invention. The TFT has a channel width W of 0.5 um and a channel length L of 0.7 um respectively and FIG. 10 shows comparison between the transistors applied with oxidation for the activation layer (shown by (I)) and not applied with oxidation (shown by (II)).

As apparent from FIG. 10, in TFT in which the active layer is oxidized to reduce the interface state density, decrease of the OFF current (Vg=0 V) by more than two digits can be attained. Further, switching property is also made abrupt.

Figure 11:
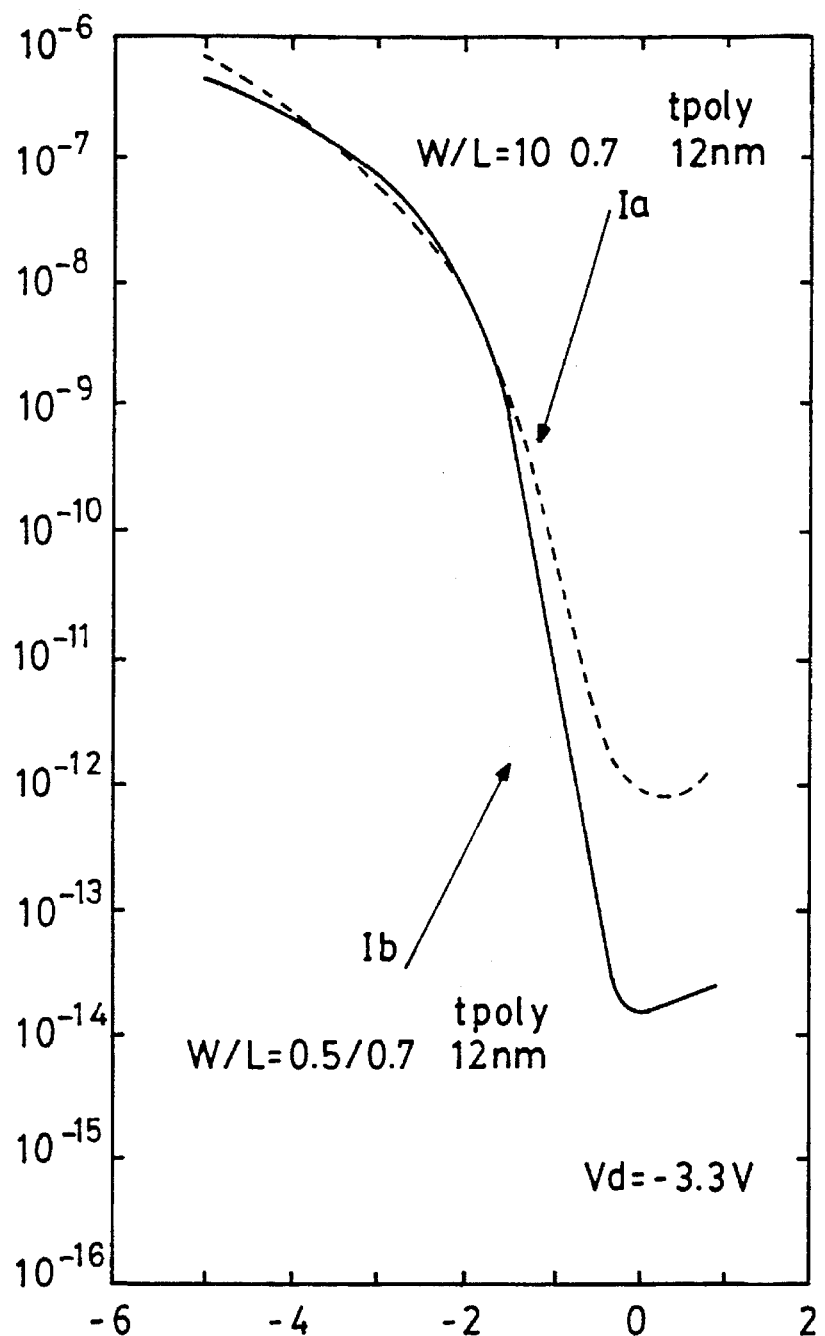
FIG. 11 is a diagram illustrating an example of a characteristic of TFT as a third embodiment according to the present invention.

FIG. 11 shows examples of the characteristics of TFT of two kinds of sizes formed by the above-method as a third embodiment according to the present invention. In this example, comparison is made between a case where W= 10 um (graph Ia) and a case where W=0.5 um (graph Ib). In a case of W=10 um, there is such a tendency that the decrease of the OFF current is not always sufficient as shown by Ia. It is considered that the oxidation for the lower surface of the active layer is not sufficient because of wide W.

Figure 12:
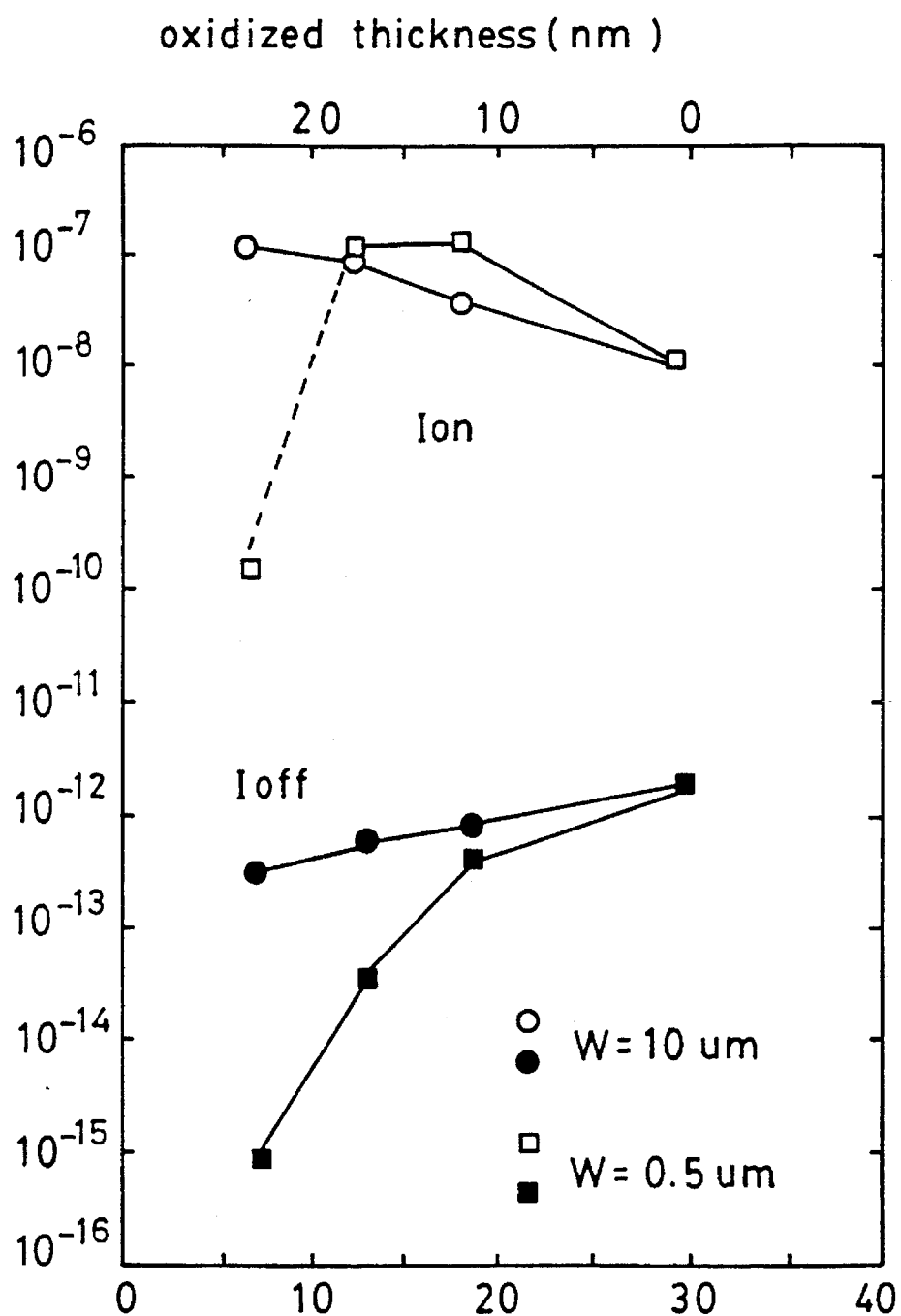
FIG. 12 is a diagram illustrating a relationship between the oxidation amount of poly-Si and ON current and OFF current.

FIG. 12 shows the situation more systemically. In FIG. 12, ON current and OFF current of TFT are shown relative to the oxidation amount of the poly-Si layer. The thickness of the poly-Si layer before oxidation is 30 nm. The thickness of the film after decrease by oxidation is shown in the lower part, while the oxidation amount is shown in the upper part above the abscissa.

Ion represents values at the drain voltage of −3 V, the gate voltage of −3.3 V. Further, Ioff represents values at −3.3 V and 0 V, respectively.

As apparent from the figure, decrease of Ioff relative to the oxidation amount is moderate at W=10 um and no remarkable improvement is obtained. Ioff is decreased remarkably along with oxidation at W=0.5 um. However, if the oxidation amount becomes excessive (oxidized by 24 nm), the channel poly-Si is partially eliminated and Ion is also decreased, as well as scattering becomes increased.

Considering the foregoing results and the oxidation mechanism together, the followings can be concluded.

Figure 13:
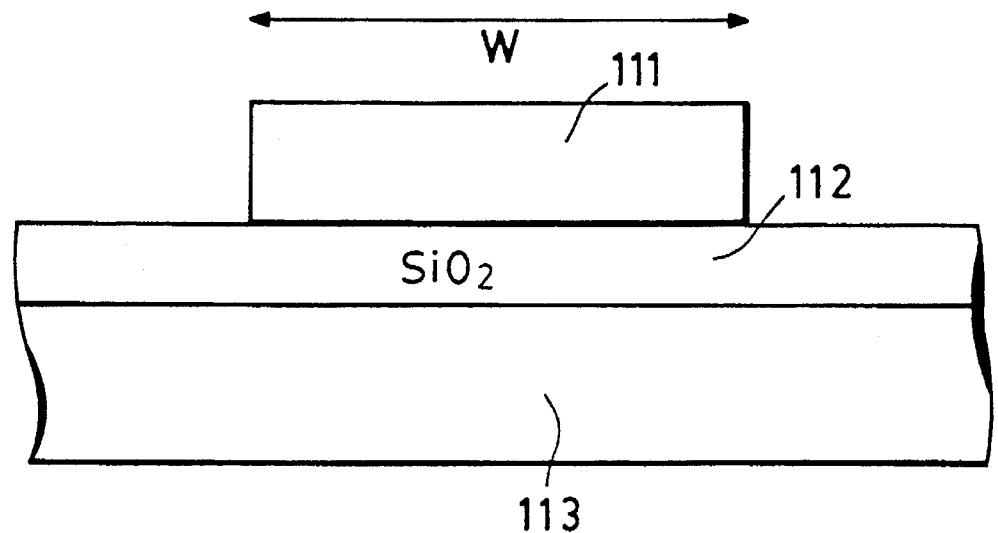
FIG. 13 is an explanatory view for the effect of oxidation mechanism.
Figure 14:
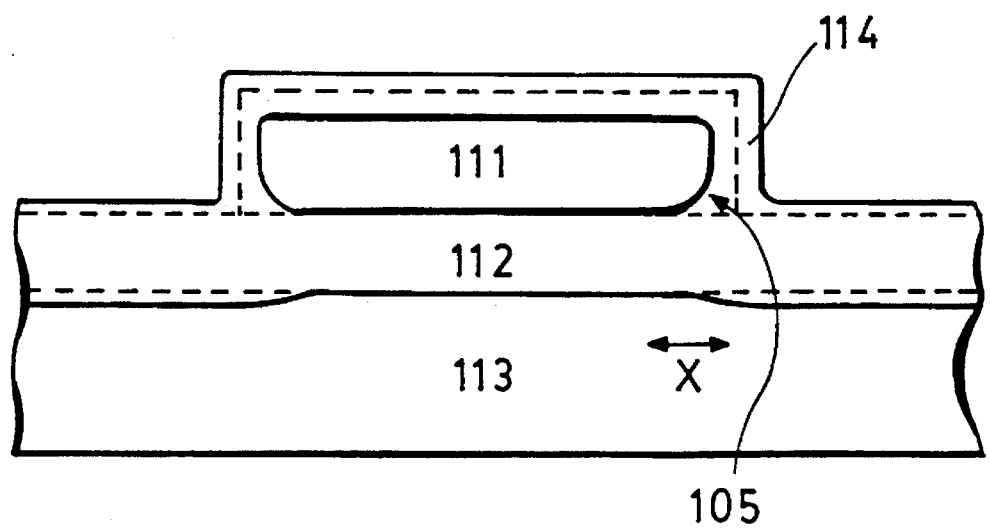
FIG. 14 is an explanatory view for the effect of oxidation mechanism.
Figure 15:
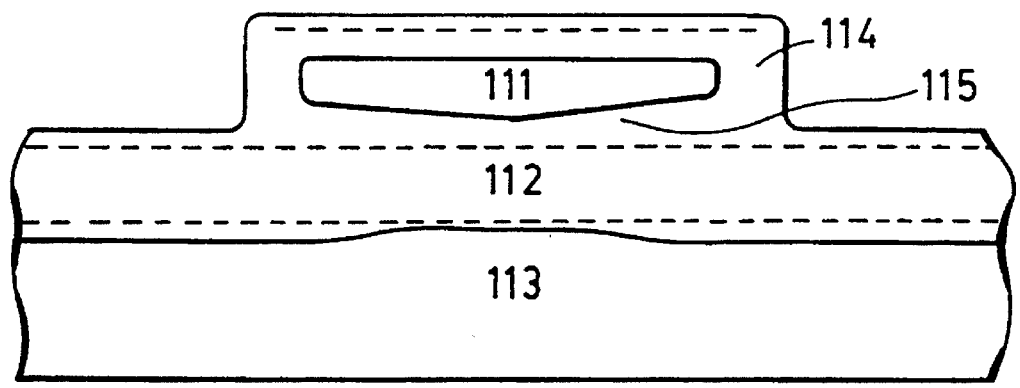
FIG. 15 is an explanatory view for the effect of oxidation mechanism.
Figure 16A:
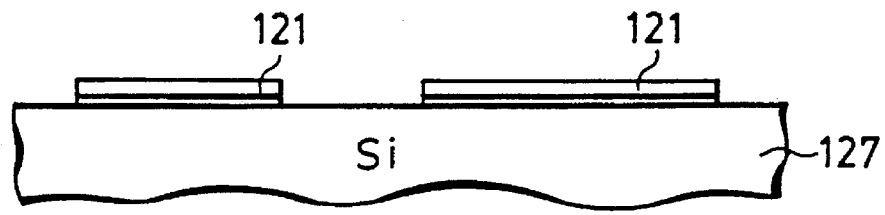
FIG. 16-A through FIG. 16-E illustrate a manufacturing process for CMOS memory cell as a fourth embodiment according to the present invention.
Figure 16B:
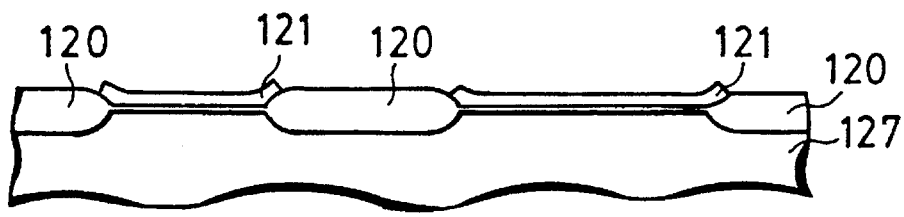
Figure 16C:
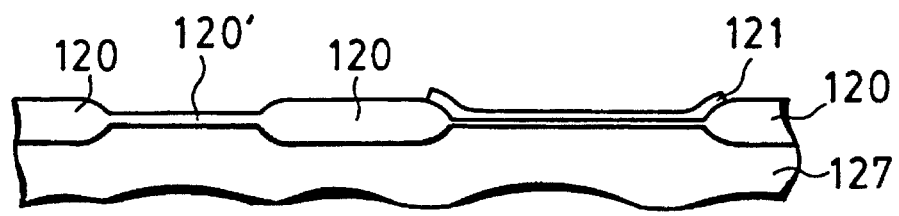
Figure 16D:
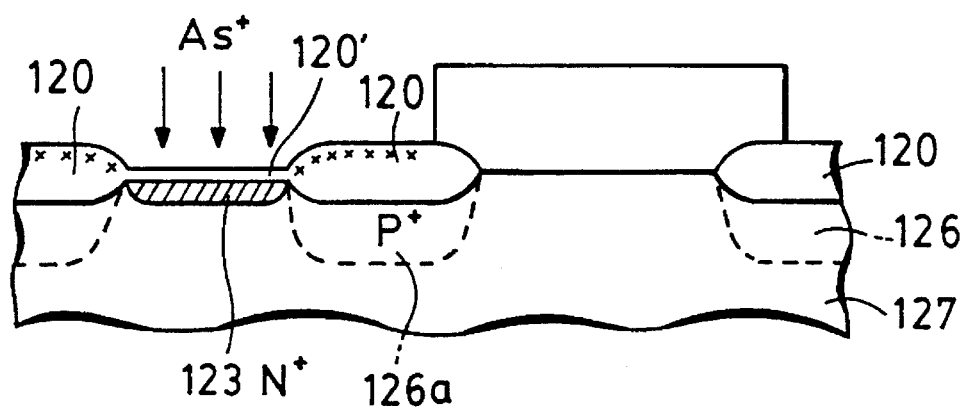
Figure 16E:
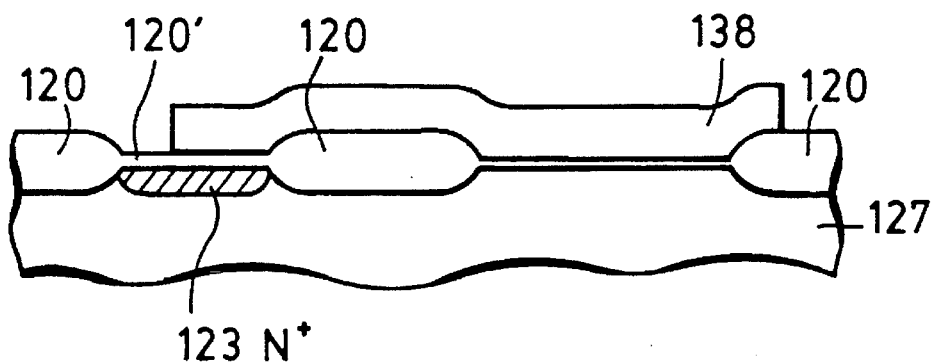

In a case of oxidizing a poly-Si 111 formed on an SiO$_2$ 112 on a substrate 113 as shown in FIG. 13, since oxidation at the lower surface of the poly-Si 111 is conducted as oxygen diffusing through SiO$_2$ 112 reaches the lower surface of the poly-Si layer 111, oxidation proceeds more easily in the vicinity of the pattern edge of the poly-Si. As shown in FIG. 14 illustrating the progress of oxidation, oxidation occurs wedgewise as is generally known, and the wedgewise region 115 is referred to as bird's beak. FIG. 15 shows a structure after sufficient oxidation.

Assuming the length x of the bird's beak (refer to FIG. 14) as x, x is a function of a thickness $t_{102}$ oxidation temperature, oxidation time or the like of the oxidation film 112.

For attaining satisfactory effect of the present invention, it is desirable that the length x of the bird's beak 115 is greater than 1/2 of the width W of the poly-Si active layer.

For instance, if $t_{102}$ is 35 nm, x is about 0.4 um by oxidation at 800° C. (20 nm on Si substrate). Accordingly, W is about less than 0.8 um. Since x is about 0.1 um in a case where $t_{102}$ is 10 nm, W=0.2 um.

While $t_{102}$, oxidation condition and W are determined in view of the design for the device and the process, it is particularly desirable in a LSI process intended to decrease the heat treatment at high temperature and for a long period of time as less as possible, to reduce the width of W, so that the lower surface of the poly-Si layer can be oxidized with less oxidation, in which a value for W of less than 1.0 um is a practically usable range.

Accordingly, as shown in FIG. 12, although the characteristic improvement is insufficient for TFT in which W= 10 um, which is much greater than x, a remarkable improvement can be attained at W=0.5 um.

Further, referring to the effect of decreasing W, since hydrogen that inactivates the interface state density or bulk traps diffuses more easily in SiO$_2$ as compared with Si, it is considered that hydrogen arrives more easily passing through SiO$_2$ of the lower layer at poly-Si or the lower layer interface as the W is reduced. Accordingly, it is considered that inactivation of traps with hydrogen is conducted more effectively in TFT with smaller or reduced W.

According to the present invention, a thin film transistor of satisfactory characteristic with reduced leak current, as well as a manufacturing method therefor can be provided.

Description will now be made to a fourth embodiment according to the present invention.

In this embodiment, the present invention is embodied for a highly integrated TFT loaded type CMOS-SRAM memory cell. FIG. 16-A to FIG. 16-E show the process in this embodiment in a cross sectional structure in each of the processes.

At first as shown in FIG. 16-A, a silicon nitride film 121 for selective oxidation of LOCOS is deposited on an Si substrate 127, and an opening is formed along a device isolation pattern.

Next, as shown in FIG. 16-B, for forming a usual device isolation region 120, a first LOCOS oxidation of about 200 nm is conducted.

Further, as shown in FIG. 16-C, a portion of the silicon nitride film corresponding to a bypass diffusion layer (reference numeral 123 in FIG. 16-E) is removed by using a lithographic step and an etching step to conduct second LOCOS oxidation by about 50 nm. This can provide a structure in which the thickness of a portion depicted by reference 120' (a left portion in FIG. 16-C) is increased.

Then, other portions of the silicon nitride film are removed, channel stop ion implantation is applied and a bypass diffusion layer 123 is formed by using an N-type impurity such as As. In this case, energy is controlled such that the N-type impurity does not intrude in the device isolation region 120 (about 100 KeV for $As^+$, IE 15 $cm^2$). This can provide a structure shown in FIG. 16-D.

Further, gate oxidation is conducted by about 10 nm, and a gate electrode 138 is formed by using a conductive film such as of Poly-Si, to obtain a structure shown in FIG. 16-E.

Figure 1:
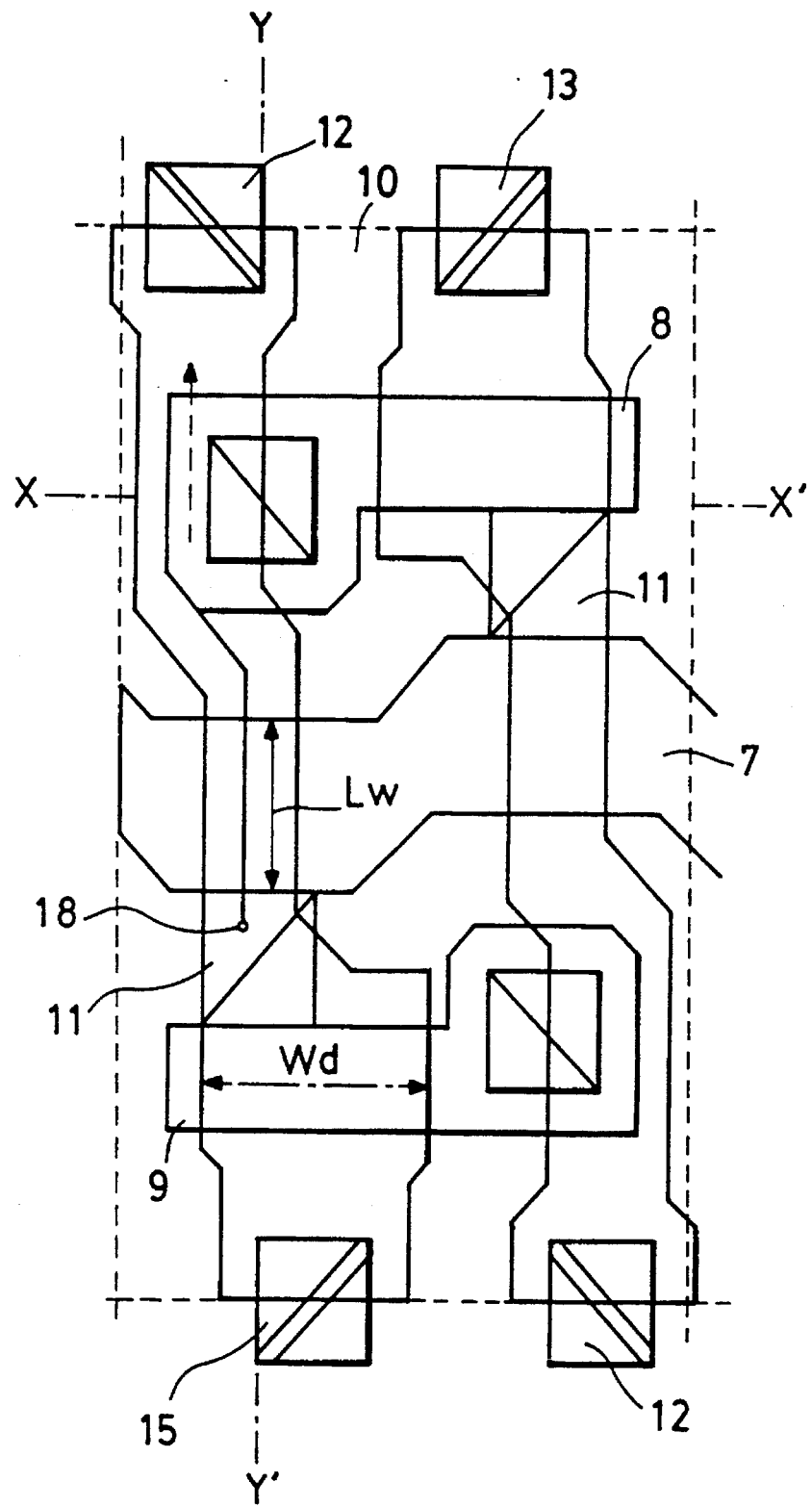
FIG. 1 is a view illustrating a planer structure of an SRAM memory cell in the prior art.
Figure 2:
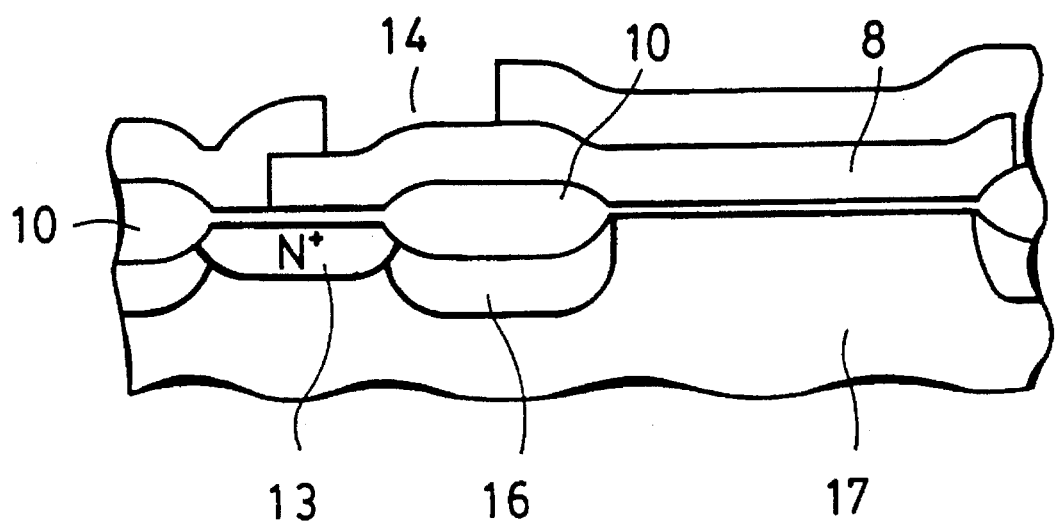
FIG. 2 is a cross sectional view for the planer structural view of the SRAM memory cell in the prior art taken along line X-X' in FIG. 1.
Figure 3:
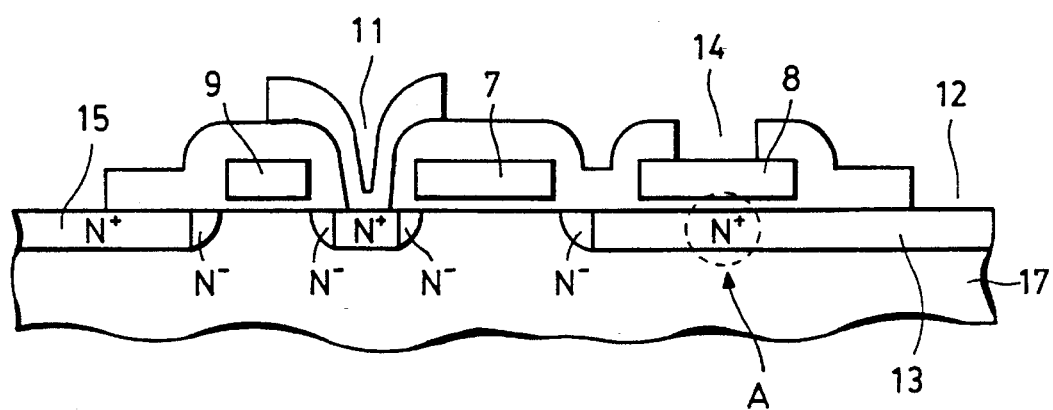
FIG. 3 is a cross sectional view for the planer structural view of the SRAM memory cell in the prior art taken along line Y-Y' in FIG. 1.
Figure 4:
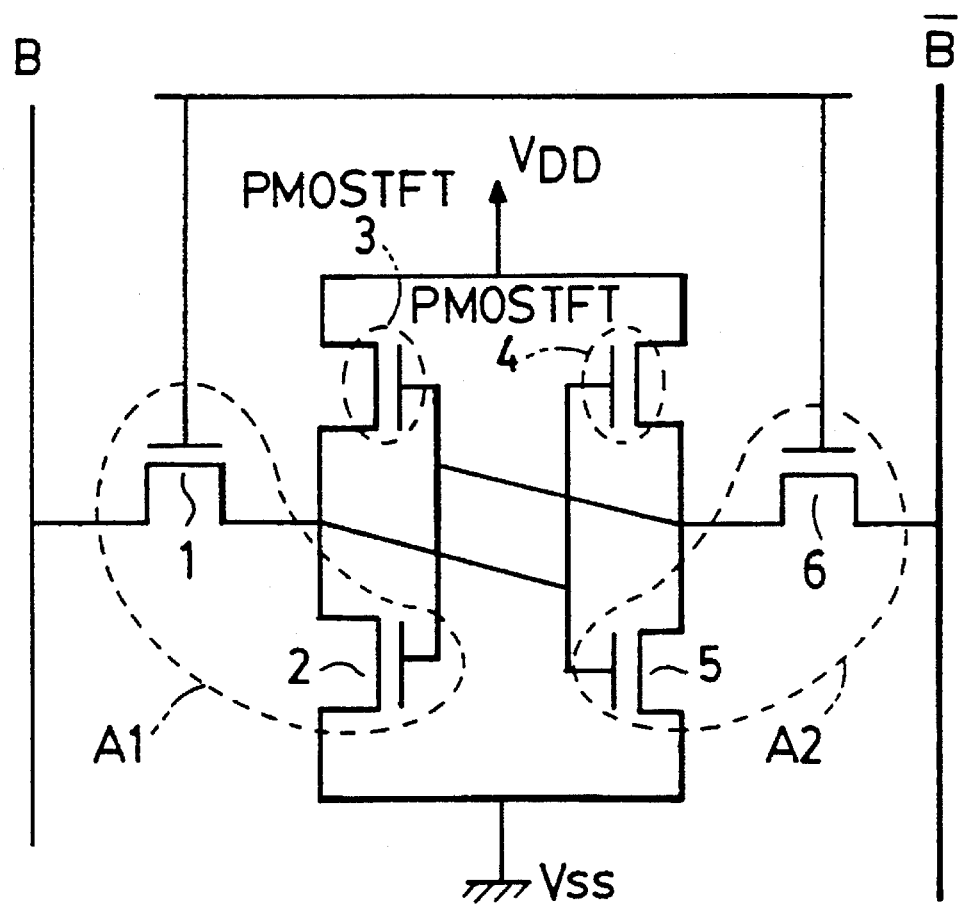
FIG. 4 is a circuit diagram of an SRAM memory cell in the prior art.

In this embodiment, the thickness of the insulation film 120' can be controlled independent of the gate oxide film, as well as out diffusion from the N-type diffusion layer therebelow upon gate oxidation can also be prevented. Accordingly, a problem in realizing the circuit structure shown in FIG. 4, that is, increase of the resistance, increase of the additional capacitance, difficulty in ensuring the insulation withstand voltage or the like can be avoided to facilitate the process design.

Numerical values and other concrete constitutions in this embodiment are shown only as examples and it will be apparent that various other constitutions can also be employed.

The present invention can provide an SRAM memory cell structure capable of facilitating the design for the process and the structure also enabling to avoid problems caused thereby such as increase of the resistance, increase of the additional capacitance, difficulty in ensuring the insulation withstand voltage or the like, as well as a method of manufacturing the SRAM memory cell structure.

What is claimed is:

1. A method of forming a SRAM memory cell comprising the steps of:

forming a polysilicon film on a silicon oxide substrate by chemical vapor deposition;

removing portions of the polysilicon film to form holes;

implanting boron difluoride ions into the remaining portions of the polysilicon film to form a gate electrode and source and drain electrodes;

forming a first silicon oxide insulation film on the gate electrode and source and drain electrodes by chemical vapor deposition;

removing portions of the first silicon oxide film on the source and drain electrodes by photolithography and etching to form contact holes;

forming an amorphous silicon film on the inside of the contact holes and the surface of the first silicon oxide insulation film;

performing annealing treatment on said amorphous silicon film to convert said amorphous silicon film into a polysilicon film;

removing portions of the polysilicon film with the remaining portions serving as an active region;

oxidizing the active region at 850° C. to form a second silicon oxide film on the active region and simultaneously form a gate oxide film at the interface between the active region and the first silicon oxide film;

forming source and drain regions adjacent opposing sides of the gate electrode by ion implantation of a p-conductivity type dopant;

forming an interlayer insulation film on the surface of the second silicon oxide film;

forming contact holes in the interlayer insulation film;

implanting boron difluoride into the interlayer insulation film after formation of the contact holes;

forming a metal wiring film on the inside of the contact holes and the surface of the interlayer insulation film;

removing portions of the metal film; and depositing silicon nitride film by plasma enhanced chemical vapor deposition.

* * * * *